bar code US011385619B2

(12) United States Patent  (10) Patent No.: US 11,385,619 B2
Nozawa  (45) Date of Patent: Jul. 12, 2022

(54) MOUNTING SYSTEM AND DISPLAY CONTROL DEVICE

(71) Applicant: FUJI CORPORATION, Chiryu (JP)

(72) Inventor: Mizuho Nozawa, Kota-machi (JP)

(73) Assignee: FUJI CORPORATION, Chiryu (JP)

( * ) Notice: Subject to any disclaimer, the term of this patent is extended or adjusted under 35 U.S.C. 154(b) by 90 days.

(21) Appl. No.: 16/493,973

(22) PCT Filed: Mar. 23, 2017

(86) PCT No.: PCT/JP2017/011768
§ 371 (c)(1),
(2) Date: Sep. 13, 2019

(87) PCT Pub. No.: WO2018/173204
PCT Pub. Date: Sep. 27, 2018

(65) Prior Publication Data
US 2020/0125073 A1    Apr. 23, 2020

(51) Int. Cl.
*G05B 19/4155*    (2006.01)
*G06F 3/14*    (2006.01)
*G08B 5/22*    (2006.01)

(52) U.S. Cl.
CPC ....... *G05B 19/4155* (2013.01); *G06F 3/1423* (2013.01); *G08B 5/22* (2013.01); *G05B 2219/31275* (2013.01)

(58) Field of Classification Search
None
See application file for complete search history.

(56) References Cited

U.S. PATENT DOCUMENTS

| 2003/0233177 A1* | 12/2003 | Johnson | G05D 1/0236 701/23 |
| 2005/0080508 A1* | 4/2005 | Kuribara | H05K 13/0061 700/228 |
| 2009/0259333 A1* | 10/2009 | Yano | G05B 19/41805 700/121 |
| 2012/0249772 A1* | 10/2012 | Nakamura | H05K 13/0061 348/94 |

(Continued)

FOREIGN PATENT DOCUMENTS

| JP | 60-62477 A | 4/1985 |
| JP | 2007-293588 A | 11/2007 |

(Continued)

OTHER PUBLICATIONS

International Search Report dated Jun. 27, 2017 in PCT/JP2017/011768 filed Mar. 23, 2017.

*Primary Examiner* — Charles E Anya
(74) *Attorney, Agent, or Firm* — Oblon, McClelland, Maier & Neustadt, L.L.P.

(57) ABSTRACT

A mounting system of the present disclosure includes a mounting line including multiple mounting machines aligned side by side in a predetermined arrangement direction and configured to mount components on a board, a supply device configured to move in the arrangement direction to convey members for use in the mounting machines and supply the members to the mounting machines, and a display section provided on each of the mounting machines and configured to change their display modes in accordance with a movement of the supply device.

20 Claims, 5 Drawing Sheets

(56) References Cited

U.S. PATENT DOCUMENTS

2016/0214259 A1\*  7/2016  Yamamoto ............. F16P 3/144
2017/0354070 A1\* 12/2017  Kobayashi ......... H05K 13/0419
2018/0242485 A1   8/2018  Kondo et al.

FOREIGN PATENT DOCUMENTS

| JP | 4347748 B2 \* | 10/2009 | ............. H05K 13/02 |
| JP | 2014-150137 A | 8/2014 | |
| WO | WO 2017/033268 A1 | 3/2017 | |

\* cited by examiner

MOUNTING SYSTEM AND DISPLAY CONTROL DEVICE

TECHNICAL FIELD

The present disclosure relates to a mounting system and a display control device.

BACKGROUND ART

Conventionally, as a mounting system, there has been known a mounting system including a mounting line in which multiple mounting machines for mounting components on a board are aligned side by side (for example, Patent Literature 1). Additionally, an unmanned conveyance vehicle (AGV, Automatic Guided vehicle) is known to be used in a production line in which multiple such mounting machines are aligned side by side (for example, Patent Literature 2). In the production line described in Patent Literature 2, an AGV conveying workpieces into the production line is described.

PATENT LITERATURE

Patent Literature 1: JP-A-2014-150137
Patent Literature 2: JP-A-2007-293588

BRIEF SUMMARY

Technical Problem

In a system including a supply device such as an unmanned conveyance vehicle for supplying members used in such a production line, there are cases where an obstacle (including an operator), present within the area surrounding the supply device or along a moving path therefor, interrupts the operation of the supply device. Then, as a result of the operation of the supply device being interrupted, there are cases where the production line is stopped until the operation of the supply device is completed, thereby decreasing the operating rate of the production line.

The present disclosure has been made in order to solve the problem described above, and a main object of the present disclosure is to prevent the operation of a supply device from being interrupted by an obstacle.

Solution to Problem

With a view toward achieving the main object, the present disclosure adopts the following measures.

According to the present disclosure, there is provided a first mounting system including: a mounting line including multiple mounting machines configured to mount components on a board and aligned in a predetermined arrangement direction; a supply device configured to supply members for use in the mounting machines by conveying the members while moving in the arrangement direction; and a display section provided on each of the mounting machines and having display modes that change in accordance with movement of the supply device.

In this first mounting system, the display modes of the display sections provided on each of the mounting machines change in accordance with the movement of the supply device. As a result, the operator can easily determine whether an object (including the operator) is likely to become an obstacle that interrupts the operation of the supply device based on the display modes of the display sections. This allows the mounting system to prompt the operator to take appropriate actions such as moving the object as required or preventing the object from coming close to the supply device. Therefore, this mounting system can prevent the operation of the supply device from being interrupted by the obstacle.

According to the present disclosure, there is provided a second mounting system including: a mounting line including multiple mounting machines configured to mount components on a board; a supply device configured to convey members for use in the mounting line; one or more display sections configured to display information for an operator; and a display control section configured to acquire operation-relevant information to an operation of the supply device and control at least one of the display sections based on the acquired operation-relevant information so as to inform the operator of operation information related to operating the supply device.

In this second mounting system, the display control section uses the display sections to inform the operator of operation information related to operating the supply device. As a result, the operator can easily determine whether the object (including the operator) is likely to become an obstacle that will interrupt the operation of the supply device based on the operation information received. This allows the mounting system to prompt the operator to take appropriate actions such as moving the object as required or preventing the object from coming close to the supply device. Therefore, this mounting system can prevent the operation of the supply device from being interrupted by the obstacle.

According to the present disclosure, there is provided a display control device configured to be used in a mounting system including a mounting line including multiple mounting machines configured to mount components on a board, a supply device configured to convey members for use in the mounting line, and one or more display sections configured to display information for an operator, the display control device including: a display control section configured to acquire operation-relevant information to an operation of the supply device and control at least one of the display sections based on the acquired operation-relevant information so as to inform the operator of operation information related to operating the supply device.

In this display control device, the display control section uses the display sections to inform the operator of operation information related to operating the supply device. As a result, the operator can easily determine whether the object (including the operator) is likely to become an obstacle that will interrupt the operation of the supply device based on the operation information received. This allows the mounting system to prompt the operator to take appropriate actions such as moving the object as required or preventing the object from coming close to the supply device. Therefore, this mounting system can prevent the operation of the supply device from being interrupted by the obstacle.

DESCRIPTION OF EMBODIMENTS

Figure 1:
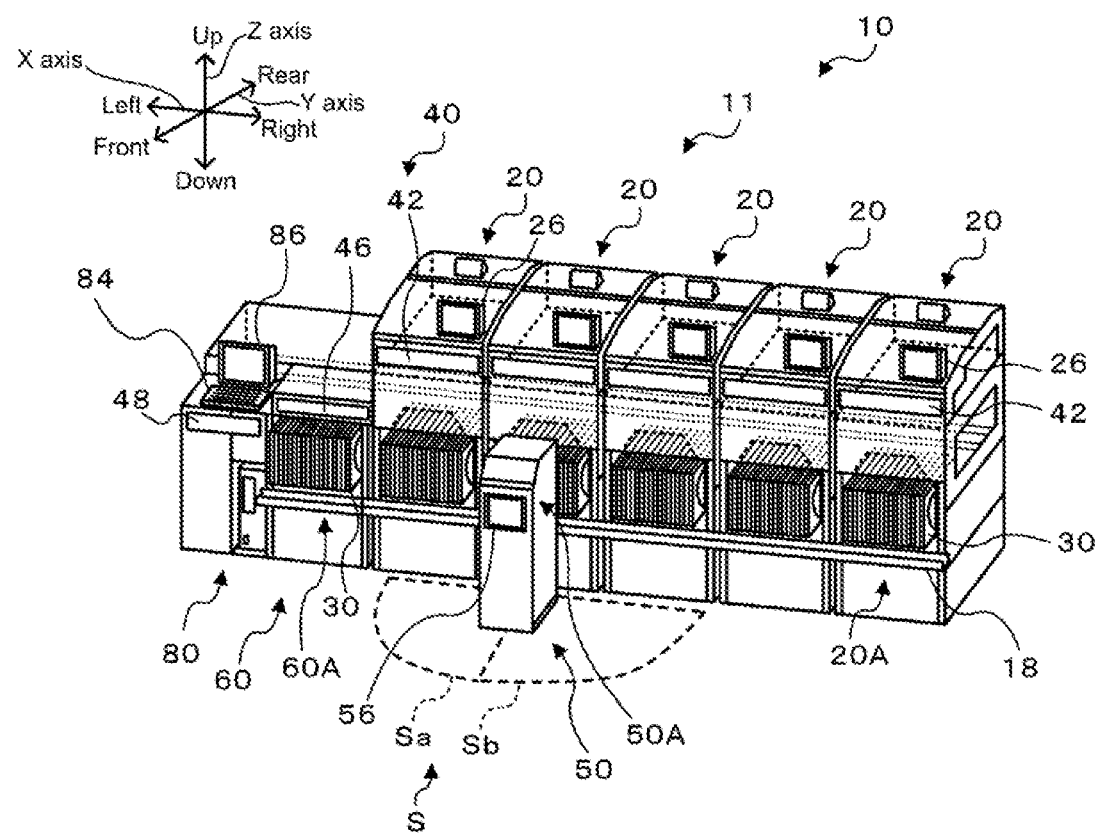
FIG. 1 is a diagram showing a schematic configuration of mounting system 10.

Hereinafter, an embodiment of a mounting system of the present disclosure will be described by reference to the drawings. FIG. 1 is a block diagram showing a schematic configuration of mounting system 10, and FIG. 2 is a configurational block diagram regarding controlling of mounting system 10 In FIG. 1, the left-right direction denotes the X direction, the front-rear direction denotes the Y direction, and the up-down direction denotes the Z direction.

As shown in FIG. 1, mounting system 10 includes mounting line 11 including multiple devices including mounting machines 20. Mounting line 11 includes multiple mounting machines 20 (five in this embodiment) for mounting components supplied from feeders 30 on a board, feeder storage container 60 capable of storing multiple feeders 30, and management device 80 configured to manage the whole of mounting system 10. In mounting line 11, management device 80, feeder storage container 60, and multiple mounting machines 20 are aligned side by side sequentially in this order in a predetermined arrangement direction (here, in the X direction, that is, in the left-right direction). The arrangement direction is parallel to a board conveyance direction (X direction) in mounting line 11. In the X direction (the left-right direction), the left side constitutes the upstream side of the conveyance direction, and the right side constitutes the downstream side of the conveyance direction. Replenishment and withdrawal of feeders 30 to and from feeder storage container 60 and mounting machines 20 are also referred to as conveyance of feeders 30 into and out of the feeder storage container 60 and mounting machines 20.

In addition, mounting system 10 includes mobile robot 50 configured to automatically convey feeders 30 into and out of multiple mounting machines 20 and feeder storage container 60. Mobile robot 50 constitutes an example of a supply device and is movable along X-axis rail 18 provided parallel to the conveyance direction of boards (the X direction) along the front faces of multiple mounting machines 20 and the front face of feeder storage container 60.

Figure 2:
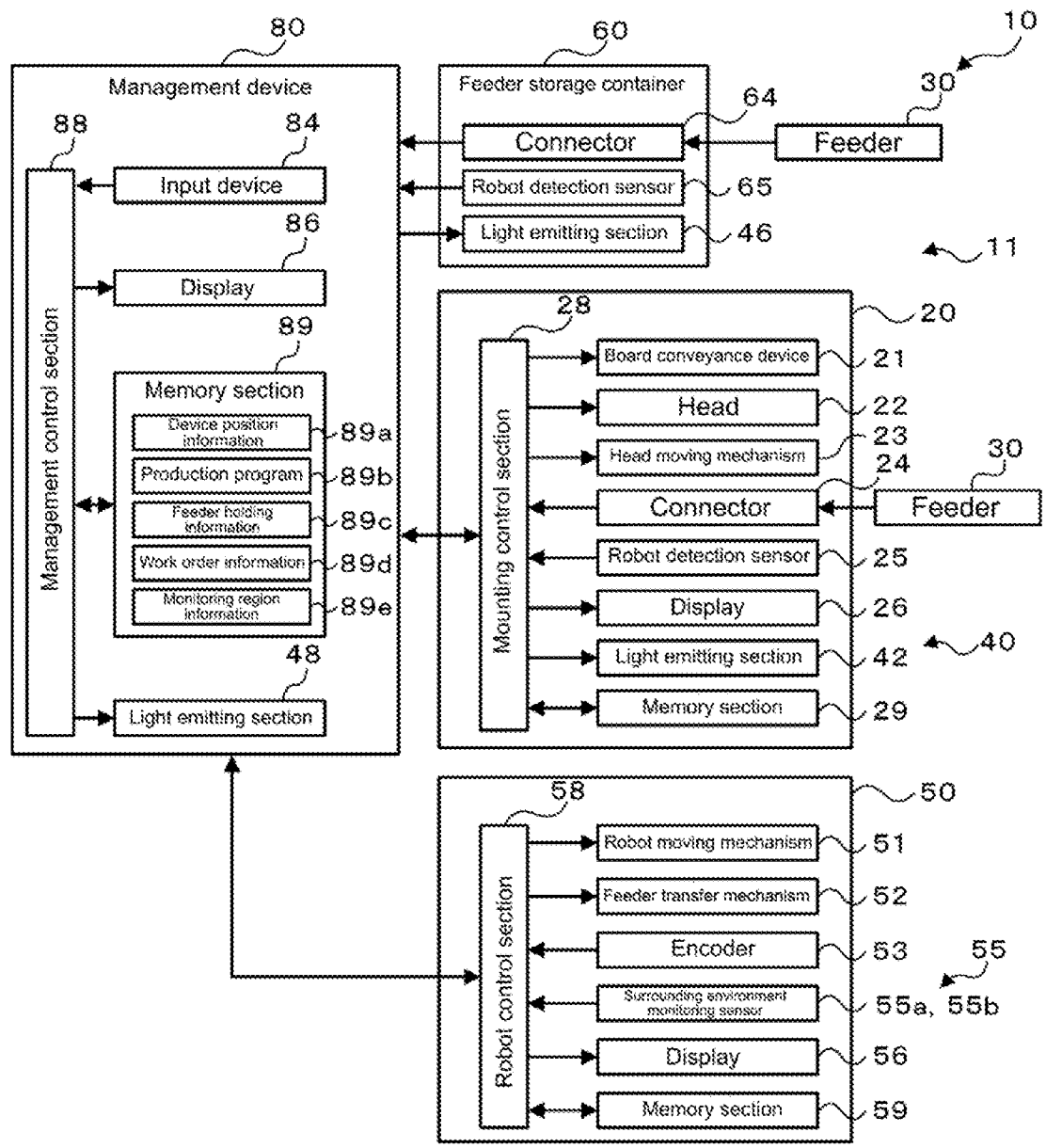
FIG. 2 is a configurational block diagram regarding controlling of mounting system 10.

As shown in FIG. 2, mounting machine 20 includes board conveyance device 21, head 22, head moving mechanism 23, multiple connectors 24, robot detection sensor 25, display 26, light emitting section 42, mounting control section 28, and memory section 29. Board conveyance device 21 conveys a board in the X direction. Head 22 includes a suction nozzle configured to pick up a component supplied by feeder 30, and head moving mechanism 23 includes, for example, a slider and a motor and moves head 22 in the X and Y directions. Multiple connectors 24 can connect individually to corresponding feeders 30, and feeder control sections of feeders 30 can communicate with mounting control section 28 via the connectors. As shown in FIG. 1, mounting machine 20 includes supply area 20A at the front thereof. Corresponding to the multiple connectors 24, supply area 20A includes multiple slots to which feeders 30 can be attached. Feeders 30 conveyed into individual slots in supply area 20A are connected to corresponding connectors 24. Robot detection sensor 25 is a sensor configured to detect mobile robot 50. Robot detection sensor 25 has a detection range directly in front of mounting machine 20 and detects whether mobile robot 50 is directly in front of mounting machine 20. Robot detection sensor 25 may be, for example, a contact type sensor disposed on X-axis rail 18 or may be a non-contact sensor such as an infrared sensor. Display 26 is, for example, an LCD and displays various types of information for the operator. Display 26 is disposed in such a manner as to be visible from the front of mounting machine 20. Light emitting section 42 is a light source unit including multiple LEDs of three colors of red, green, and blue and can emit light of various colors. Light emitting section 42 is disposed on the front face of mounting machine 20. Mounting control section 28 includes CPU, ROM, RAM, and the like and controls the whole of mounting machine 20. Memory section 29 is a non-volatile memory such as HDD and stores various types of information. Mounting control section 28 outputs drive signals to board conveyance device 21, head 22, and head moving mechanism 23, outputs display signals to display 26, and outputs light emission signals to light emitting section 42. Mounting control section 28 receives various types of information on feeders 30 via connectors 24 and receives a detection signal inputted from robot detection sensor 25. Mounting control section 28 exchanges information with memory section 29.

Feeder 30 is configured as a tape feeder including tape on which multiple components are housed at a predetermined pitch. Although not shown in detail, feeder 30 includes a reel around which tape is wound, a tape feeding mechanism configured to draw the tape out from the reel for feeding, a feeder control section configured to control the whole of the feeder, and a memory section. In feeder 30, the tape is fed out by the feeder control section outputting a drive signal to tape feeding mechanism 33, and components housed in the tape are ready to be picked up by the suction nozzle on head 22. The memory section stores feeder information such as ID information of feeder 30, the type of components installed therein, and the number of components installed therein. When feeder 30 is connected to connector 24 or connector 64, the feeder control section can communicate with a control section (mounting control section 28 or management control section 88) of the mounting destination via connector 24 or 64.

Mobile robot 50 is a device for conveying feeders 30 that are to be used in mounting machines 20. Mobile robot 50 includes robot moving mechanism 51, feeder transfer mechanism 52, encoder 53, surrounding environment monitoring sensor 55, display 56, robot control section 58, and memory section 59. Robot transfer area 50A capable of accommodating multiple feeders 30 is provided inside the housing of mobile robot 50. Robot transfer area 50A includes multiple slots where feeders 30 can be accommodated. Robot moving mechanism 51 includes, for example, a drive belt, a servo motor for driving the drive belt, and the like, and moves mobile robot 50 in the X direction along the X-axis rail 18 shown in FIG. 1. Feeder transfer mechanism 52 is a mechanism configured to move feeder 30 back and forth and includes, for example, a clamp section configured to clamp feeder 30, a Y-axis motor configured to move the clamp section in the Y direction, a Y-axis slider, and the like. Feeder transfer mechanism 52 carries feeder 30 accommodated in robot transfer area 50A forwards into supply area 20A of mounting machine 20 or feeder storage area 60A of feeder storage container 60. In addition, transfer mechanism 52 conveys feeder 30 accommodated in supply area 20A of mounting machine 20 or feeder storage area 60A of feeder storage container 60 out to the rear to accommodate it in robot transfer area 50A. Encoder 53 detects a movement position of mobile robot 50 moved in the X direction by robot moving mechanism 51. Surrounding environment monitoring sensor 55 is a sensor configured to monitor the surrounding environment for an obstacle (including the operator), and the interior area of monitoring region S shown in FIG. 1 constitutes a detection (monitoring) range. Surrounding environment monitoring sensor 55 includes left-side monitoring sensor 55a configured to monitor a left-hand side of monitoring region S (the inside of left-side monitoring region Sa shown in FIG. 1) and right-side monitoring sensor 55b configured to monitor a right-hand side of monitoring region S (the inside of right-side monitoring region Sb shown in FIG. 1). Left-side monitoring sensor 55a and right-side monitoring sensor 55b are, for example, infrared sensors. As shown in FIG. 1, the range of monitoring region S is set such that, with mobile robot 50 located directly in front of mounting machine 20, monitoring region S includes the regions directly in front of mounting machines 20 directly adjacent to the left and right of mounting machine 20 in question but does not include regions directly in front of mounting machines 20 located one mounting machine 20 further to the left and right. Display 56 is, for example, an LCD, and displays various types of information for the operator. Display 56 is disposed at the front side so as to be visible from the front of mobile robot 50. Robot control section 58 includes CPU, ROM, RAM, and the like, and controls the whole of mobile robot 50. Memory section 59 is a non-volatile memory such as HDD and stores various types of information. Robot control section 58 outputs drive signals to robot moving mechanism 51 and feeder transfer mechanism 52, and outputs a display signal to display 56. Robot control section 58 receives a detection signal inputted from encoder 53 to detect the current position of mobile robot 50 in the X direction, and receives a detection signal inputted from surrounding environment monitoring sensor 55. Robot control section 58 exchanges information with memory section 59.

As shown in FIG. 1, feeder storage container 60 has storage area 60A at the front side of the housing. Storage area 60A includes multiple slots to which feeders 30 can be attached. Storage area 60A is provided at the same height (position in the Z direction) as supply area 20A of mounting machine 20. As a result, mobile robot 50 can attach and detach feeders 30 to and from storage area 60A of feeder storage container 60 through the same operation as attaching and detaching feeders 30 to and from supply area 20A of mounting machine 20. In storage area 60A, connectors 64 like connectors 24 are disposed in such a manner as to individually correspond to multiple slots. Feeders 30 carried into storage area 60A are connected to corresponding connectors 64 (refer to FIG. 2). Storage area 60A accommodates both feeders 30 scheduled to be used in mounting machines 20 and feeders 30 that have been used in mounting machines 20. As shown in FIG. 2, feeder storage container 60 includes robot detection sensor 65 and light emitting section 46, which are the same as robot detection sensor 25 and light emitting section 42. Robot detection sensor 65 has a detection range directly in front of feeder storage container 60 and detects a presence of mobile robot 50 directly in front of feeder storage container 60. Light emitting section 46 is disposed on the front face of the housing of feeder storage container 60. In this embodiment, the operator supplies feeders 30 into storage area 60A and withdraws used feeders 30 from storage area 60A. However, in place of the operator, for example, an unmanned conveyance vehicle (AGV), not shown, may supply, withdraw, and convey feeders 30.

As shown in FIG. 1, management device 80 includes input device 84 such as a keyboard and a mouse, display 86 such as an LCD, and light emitting section 48. Light emitting section 48 is a light source unit like light emitting section 42 and light emitting section 46, and is disposed on a front face of the housing of management device 80. Light emitting section 42, light emitting section 46, and light emitting section 48 are collectively referred to as light emitting section 40. Although this will be described in detail later, light emitting section 40 displays information for the operator by controlling light emission modes. As shown in FIG. 2, management device 80 includes management control section 88 and memory section 89. Management control section 88 includes CPU, ROM, RAM, and the like, and controls the whole of management device 80, as well as the whole of mounting system 10. Memory section 89 is a non-volatile memory such as an HDD and stores various types of information. Management control section 88 inputs an instruction of the operator via input device 84, outputs a display signal to display 86, and outputs a light emission signal to light emitting section 48. Management control section 88 receives various types of information on feeders 30 attached to storage area 60A via connectors 64 by wire, receives a detection signal from robot detection sensor 65, and outputs a light emission signal to light emitting section 46. Management control section 88 exchanges information with memory section 89. In addition, management control section 88 is connected with mounting control section 28 so as to communicate therewith by wire and is connected with robot control section 58 so as to communicate therewith wirelessly, and outputs various control signals thereto. Management control section 88 receives information on the mounting status of mounting machine 20 from mounting control section 28, and receives information on the driving status of mobile robot 50 from robot control section 58.

As shown in FIG. 2, memory section 89 stores device position information 89a, production program 89b, feeder holding information 89c, work order information 89d, and monitoring region information 89e. Device position information 89a is information capable of identifying the positions of the devices constituting mounting line 11 (here, mounting machines 20, feeder storage container 60, and management device 80). Device position information 89a is, for example, information in which identification information and position information of each device are associated with each other. Position information may be, for example, numbers assigned from the upstream side to the downstream side in the X direction, or may be an X coordinate. In the present embodiment, one light emitting section 40 is provided for each device constituting mounting line 11, and management control section 88 can identify the position of each of multiple light emitting sections 40 (here, the position in the X direction) based on device position information 89a. That is, device position information 89a doubles as information capable of identifying the position of each of multiple light emitting sections 40. Production program 89b is a program that determines which component is to be mounted on which board by which mounting machine 20, how many boards on which components are so mounted are to be produced, and the like.

Feeder holding information 89c is information on feeders 30 set in each area of supply area 20A, robot transfer area 50A, and storage area 60A. Feeder holding information 89c is, for example, information in which area identification information identifying the areas individually, slot numbers representing the positions of feeders 30 in the areas, and feeder information of feeders 30 (ID information, information on the types, and numbers of accommodated components) are associated with each other. Based on this feeder holding information 89c, management control section 88 can identify in which position (slot) in each area feeder 30 is mounted, which slots in each area are empty (a state in which no feeder 30 is mounted), and the like. Feeder holding information 89c is updated to the latest state every time feeders 30 are attached to and detached from the individual areas. For example, when feeder 30 is connected to either of connector 24 and connector 64, the control section at the connection destination (mounting control section 28 or management control section 88) acquires feeder information from feeder 30, and management control section 88 updates feeder holding information 89c relevant to supply area 20A and storage area 60A. Further, since management control section 88 holds information on the area in which mobile robot 50 conveys feeders 30 in and out next and feeders 30 to be conveyed in and out, based on this information, management control section 88 updates feeder holding information 89c relevant to robot transfer area 50A. For example, when feeders 30 are detached from either connectors 24 or connectors 64, and in a case where feeders 30 constitute a conveyance target that mobile robot 50 conveys out, deeming that feeders 30 are accommodated in mobile robot 50, management control unit 88 updates feeder holding information 89c relevant to robot transfer area 50A. Mobile robot 50 includes connectors similar to connectors 24, and hence, management control section 88 may also receive information on attachment/detachment of feeders 30 and feeder information from mobile robot 50 to update feeder holding information 89c. Information on the number of components in the feeder information may constitute information capable of identifying whether the number of components of feeder 30 is "Full" (unused) or "Empty" (already used in mounting machine 20) or may constitute a value representing the number of remaining components. In the latter case, management control unit 88 acquires the number of remaining components on each feeder 30 from mounting control section 28 at each predetermined cycle to update feeder holding information 89c.

Work order information 89d is information on the order in which mobile robot 50 moves to which of mounting machine 20 and feeder storage container 60 to convey in and out feeders 30. Work order information 89d is associated with, for example, order information indicating a work order, movement destination information that can identifying a movement destination position, work content information, and completion information indicating whether the work has been completed. Movement destination information may be, for example, the same information as the position information of the devices included in device position information 89a. Work content information includes, for example, a work type indicating whether to convey feeders in or convey feeders out, working target slot numbers to be worked on (slot numbers in robot transfer area 50A and slot numbers in the area of the corresponding or mating device), and the like. Multiple pieces of work content information in the same destination position may be associated with one work order. Work order information 89d is determined in advance by the operator based on, for example, production program 89b so that feeder 30 installing necessary components is conveyed into each mounting machine 20 before mounting line 11 is stopped due to a shortage of components on feeder 30. When the loading of feeders 30 into mounting machine 20 is delayed due to, for example, the operation of mobile robot 50 being stopped, management control section 88 may change work order information 89d based on production program 89b and feeder holding information 89c so as to shorten the halt time of mounting line 11 due to the shortage of components as much as possible.

Monitoring region information 89e is information capable of identifying monitoring region S of surrounding environment monitoring sensor 55 of mobile robot 50. Feeder holding information 89c includes, for example, information indicating the relative position of surrounding environment monitoring sensor 55 with respect to the position of mobile robot 50. In the present embodiment, monitoring region information 89e includes information indicating that the position of one device directly to the right and left of the device are included in monitoring area S with the position of mobile robot 50 as a reference. Monitoring region information 89e may include information representing monitoring region S by relative XY coordinates with reference to mobile robot 50 as an origin.

Next, an operation of mounting system 10 configured as described above, in particular, an operation of mobile robot 50 and a display control of light emitting section 40 associated therewith will be described. First, an operation of mobile robot 50 will be described. Management control section 88 executes work control processing for controlling the work of mobile robot 50. In this processing, first, management control unit 88 identifies a movement destination position to which mobile robot 50 is to move next and the content of work mobile robot 50 carries out next based on work order information 89d. Management control section 88 specifies, for example, the operation being the earliest in the sequence among incomplete operations stored in work order information 89d, and identifies the next moving destination position and work contents to be carried out there. Subsequently, management control section 88 transmits information on the identified movement destination position and work contents to robot control section 58 and waits for robot control section 58 to arrive at the movement destination position. Robot control section 58 starts moving to the next destination position based on the received information, and when arriving at the destination position, robot control section 58 causes mobile robot 50 to convey in and out feeders 30 based on the received work contents. Management control section 88 repeats the series of operations described above when it detects that mobile robot 50 has arrived at the movement destination position based on a detection signal of robot detection sensor 25 inputted from mounting control section 28 or a detection signal inputted from robot detection sensor 65, for example. That is, management control section 88 identifies a movement destination position to which mobile robot 50 moves next and the contents of work to be executed next, transmits information on the identified movement destination position and work contents to robot control section 58, and waits for mobile robot 50 to arrive at the movement destination position. In this way, management control section 88 identifies the next movement destination position and work contents each time mobile robot 50 arrives at the movement destination position and transmits the information to mobile robot 50. Based on the received information, robot control section 58 repeatedly moves to the subsequent movement destination position and performs the work (conveys in and out feeders 30) there. As a result, mobile robot 50 conveys unused feeders 30 stored in feeder storage container 60 to mounting machine 20 and conveys out used feeders 30 from mounting machine 20 back to feeder storage container 60. Here, when management control section 88 acquires information on feeders 30 newly conveyed in or conveyed out via connectors 24 or connectors 64, management control section 88 updates feeder holding information 89c based on the acquired information, and when management control section 88 detects completion of the work contents based on the acquired information, management control section 88 updates the completion information of work order information 89*d*.

Next, surrounding environment monitoring processing of monitoring the area surrounding mobile robot 50 executed by robot control section 58 will be described. This processing is executed when a power supply of mobile robot 50 is turned on. In this surrounding environment monitoring processing, firstly, robot control section 58 waits until an obstacle is detected in monitoring region S based on a detection signal from surrounding environment monitoring sensor 55. When an obstacle is detected, robot control section 58 stops the operation of mobile robot 50. Specifically, in the case where mobile robot 50 is moving, movement of mobile robot 50 is stopped, whereas in the case where mobile robot 50 is conveying in or out feeders 30, mobile robot 50 is stopped from conveying in or out feeders 30. Then, robot control section 58 waits until no obstacle is detected in monitoring region S based on a detection signal from surrounding environment monitoring sensor 55. When no obstacle is detected in monitoring region S, robot control section 58 resumes the stopped operation and repeats the series of operations described above. Mobile robot 50 in operation is prevented from coming into contact with the obstacle by robot control section 58 performing the surrounding environment monitoring processing.

Figure 3:
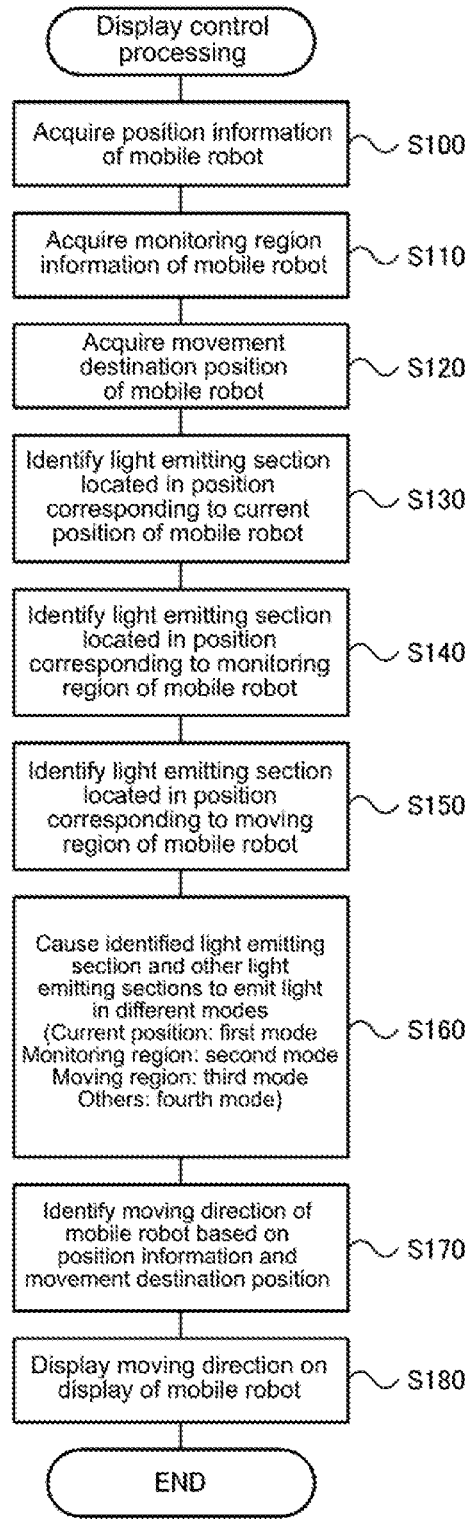
FIG. 3 is a flowchart of display control processing.

Next, a display control of light emitting section 40 performed by management control section 88 will be described. FIG. 3 is a flowchart showing an example of display control processing. This processing is repeatedly executed when a power supply of management control section 88 is turned on. In the present embodiment, by executing this display control processing, management control section 88 controls not only light emitting section 40 but also display 56. When starting the display control processing, management control section 88 first acquires position information that can identify the current position of mobile robot 50 (step S100). The position information is, for example, information indicating the position of mobile robot 50 which is located in a position corresponding to a position corresponding to (here, a position located directly in front of) any one of the devices of mounting line 11. Management control section 88 acquires a detection signal of robot detection sensor 25 inputted from mounting control section 28 and a detection signal inputted from robot detection sensor 65 and then acquires position information indicating the current position of mobile robot 50 based on these signals so acquired. Management control section 88 may acquire position information on mobile robot 50 based on encoder 53 from robot control section 58.

Subsequently, management control section 88 reads out and acquires monitoring region information 89*e* capable of identifying monitoring region S of mobile robot 50 from memory section 89 (step S110) and acquires information capable of identifying a subsequent movement destination position of mobile robot 50 (step S120). In step S120, for example, similarly to the work control processing described above, management control section 88 acquires information on a movement destination position to which mobile robot 50 is to move next based on work order information 89*d* stored in memory section 89. Since management control section 88 identifies (determines on) a subsequent movement destination position in the work control processing described above, this processing is understood as doubling as the processing in step S120, and step S120 may be omitted here. In this way, in steps S100 to S120, management control section 88 acquires the position information of mobile robot 50, monitoring region information 89*e*, and the information on the subsequent movement destination position as operation-relevant information relevant to the operation of mobile robot 50.

When acquiring the operation-relevant information, management control section 88 identifies light emitting section 40 located in a position corresponding to the current position of mobile robot 50 based on the position information acquired in step S100 (step S130). Here, based on the acquired position information of mobile robot 50 and device position information 89*a*, management control section 88 identifies the device facing mobile robot 50 in the devices of mounting line 11, that is, the device located directly behind the mobile robot 50 and then identifies light emitting section 40 of the device.

Next, management control section 88 identifies light emitting section 40 located in a position corresponding to monitoring region S of mobile robot 50 based on the position information and monitoring region information 89*e* acquired in steps S100, S110 (step S140). Here, based on the acquired position information, monitoring region information 89*e*, and device position information 89*a*, the management control section 88 identifies the device located opposite to monitoring region S of mobile robot 50 in the devices of mounting line 11, and then identifies light emitting section 40 of the device. The device located opposite to monitoring region S is a device positioned directly behind monitoring region S in the present embodiment. As described above, monitoring region S is a range including one device located directly to the left and right of the device located opposite to mobile robot 50 in the X direction. Due to this, management control section 88 identifies the three devices, i.e., the device corresponding to the current position of mobile robot 50 and the devices located directly to the left and right of the device in question as devices corresponding to monitoring region S. Then, management control section 88 identifies light emitting sections 40 that the three devices include as light emitting sections 40 located in the positions corresponding to monitoring region S.

Following this, management control section 88 identifies light emitting section 40 located in a position corresponding to a moving region of mobile robot 50 based on the position information and the subsequent movement destination position acquired in step S100, S120 (step S150). The moving region is a region defined from the current position to a subsequent movement destination position of mobile robot 50. Here, based on the position information and the subsequent movement destination position that are obtained as described above and device position information 89*a*, management control section 88 identifies the device, among the devices of mounting line 11, that is located in a position corresponding to the moving region of mobile robot 50 and then identifies light emitting section 40 of the device. In this way, in steps S130 to S150, management control section 88 identifies the device, among the devices of mounting line 11, that is located in the position corresponding to an operation interrupting region (here, the current position of mobile robot 50, monitoring region S, and the moving region) that is likely to interrupt the operation of mobile robot 50 and then identifies light emitting section 40 that the device in question includes.

Upon identifying light emitting section 40 corresponding to the operation interrupting region, management control section 88 outputs a light emission signal to each of multiple light emitting sections 40 to cause, among multiple light emitting sections 40, identified light emitting section 40 and other remaining light emitting sections 40 to be illuminated in different modes (step S160). That is, management control section 88 causes light emitting section 40 corresponding to at least any one of the current position, monitoring region S, and the moving region of mobile robot 50 (light emitting section 40 corresponding to the operation interrupting region) and other remaining light emitting sections 40 to be illuminated in different modes. In the present embodiment, management control section 88 causes light emitting sections 40 to be illuminated or emit light rays in different colors. In addition, in the present embodiment, management control section 88 also causes light emitting sections 40 located in the positions corresponding to the operation interrupting region to be illuminated or emit light rays in different colors in accordance with their positions, that is, depending upon which of the current position, monitoring region S and the moving region those light emitting sections 40 correspond to. Since the current position, monitoring region S, and the moving region overlap one another partially, priority is given to the light emitting modes in the order of the current position, monitoring region S, and the moving region, and management control section 88 causes light emitting section 40 to be illuminated or emit light in the light emitting mode of higher priority when light emitting section 40 in question is located in the position where the current position and the monitoring and moving regions overlap. The priority may be determined in descending order of the need to inform the operator. Specifically, management control section 88 causes light emitting section 40 corresponding to the current position to emit light in a first mode (for example, in red), causes light emitting section 40 corresponding to monitoring region S but not corresponding to the current position to emit light in a second mode (for example, in orange), and causes light emitting section 40 corresponding to neither of the current position and monitoring region S but corresponding to the moving region to emit light in yellow. Then, other remaining light emitting sections 40 are caused to made to emit light in a fourth mode (for example, in green). Management control section 88 informs the operator of the operation interrupting region by illuminating light emitting sections 40 in the way described above.

Next, management control section 88 identifies moving directions of mobile robots 50 based on position information and subsequent movement destination position acquired in step S100, S120 (step S170). In the present embodiment, management control section 88 identifies whether mobile robot 50 moves to the left or right when mobile robot 50 moves next based on the acquired position information, subsequent movement destination position, and device position information 89a. Then, management control section 88 causes display 56 of mobile robot 50 to display the identified moving direction thereon (step S180). Management control section 88 causes display 56 to display, for example, an arrow pointing either to the left or the right thereon. When the display control of light emitting sections 40 is executed as in step S160 and the display control of display 56 is executed as in step S180, management control section 88 ends the present routine.

Figure 4:
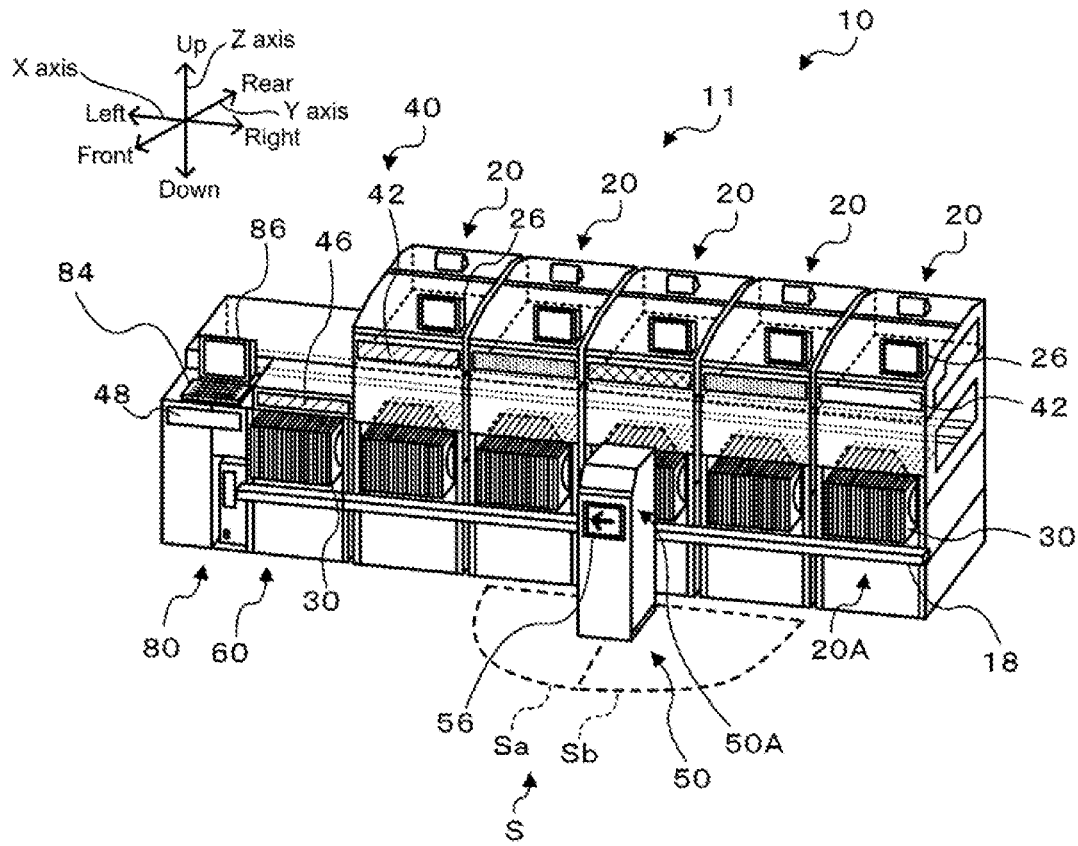
FIG. 4 is a diagram showing an example of a display mode of light emitting section 40 and display 56.

FIG. 4 is a diagram showing an example of display modes of light emitting section 40 and display 56. FIG. 4 shows an example in which mobile robot 50 is positioned directly in front of third mounting machine 20 from the right end of mounting line 11, and the subsequent movement destination position is feeder storage container 60. In this case, as shown in FIG. 4, management control section 88 causes third light emitting section 42 from the right end of mounting line 11, that is located in the position corresponding to the current position of mobile robot 50, to emit light in the first mode. Management control section 88 causes light emitting sections 42 of mounting machines 20 that are located directly to the left and right of light emitting section 40 located in the position corresponding to the current position of mobile robot 50, both of which are light emitting sections 40 not corresponding to the current position but corresponding to monitoring region S, to emit light in the second mode. Management control section 88 causes leftmost light emitting section 42 and light emitting section 46, both of which are light emitting sections 40 not corresponding to both current position of mobile robot 50 and monitoring region S but corresponding to the moving region, to emit light in the third mode. Then, management control section 88 causes rightmost light emitting section 42 and light emitting section 48, which constitute other remaining light emitting sections 40, to emit light in the fourth mode. In addition, management control section 88 causes display 56 to display thereon a leftward arrow indicating the moving direction of mobile robot 50. As a result, the operator can recognize the current position, monitoring region S, and the moving region of mobile robot 50 based on the position and the light emitting mode (here, the color of emitted light) of each of multiple light emitting sections 40. In addition, the operator can recognize the position located farthest from the current position of mobile robot 50 in the moving region as a subsequent movement destination position of mobile robot 50. Further, the operator can recognize a subsequent moving direction of mobile robot 50 by the direction of the arrow displayed on display 56. As a result, management control section 88 can prompt the operator to take appropriate measures to prevent the operation of mobile robot 50 from being interrupted. As a result, the operator attempts to prevent himself or herself from coming close to regions directly in front of the devices including light emitting sections 40 emitting light in the first and second modes. In addition, when the operator is working in a region directly in front of any one of the devices of mounting line 11, in a case where light emitting section 40 of the device in question emits light in a mode other than the fourth mode, the operator should withdraw from the region. Alternatively, when light emitting section 40 of the device on which the operator is working emits light in the third mode, although the operator does not have to withdraw therefrom promptly, a risk of the operator interrupting the movement of mobile robot 50 when mobile robot 50 moves toward the operator. As a result, the operator withdraws from the device on which he or she is working as required while checking the expected movement of mobile robot 50. In addition, when there is an object directly ahead of light emitting section 40 emitting light in any one of the modes other than the fourth mode, the operator removes the object. By prompting the operator to take appropriate measures in the way described above, mobile robot 50 can be prevented from being stopped operating in the surrounding environment monitoring processing described above, thereby suppressing deterioration in the operating rate of mounting line 11 due to halting of mounting line 11.

Since management control section 88 repeatedly performs the display control processing described above, the display modes of light emitting sections 40 and display 56 also change in accordance with the current state of mobile robot 50. For example, when robot 50 moves from the state shown in FIG. 4 to adjacent mounting machine 20 located directly to the left of mounting machine 20 to which mobile robot 5 corresponds in FIG. 4, management control section 88 causes second leftmost light emitting section 42, which corresponds to the current position of mobile robot 50, to emit light in the first mode and causes light emitting sections 42 of mounting machines 20 located directly to the left and right of mounting machine 20 to which mobile robot 50 currently corresponds to emit light in the second mode. In addition, management control section 88 causes light emitting section 46, which constitutes light emitting section 40 not corresponding to both the current position and monitoring region S of mobile robot 50 but corresponding to the moving region thereof, to emit light in the third mode and causes other remaining light emitting sections 40 to emit light in the fourth mode. As a result, when mobile robot 50 moves from the state shown in FIG. 4 to adjacent mounting machine 20 located directly to the left of mounting machine 20 to which mobile robot 50 corresponds in the state shown in FIG. 4, the light emitting mode of leftmost light emitting section 42 at the left end changes from the third mode to the second mode, the light emitting mode of second leftmost light emitting section 42 changes from the second mode to the first mode, the light emitting mode of third leftmost light emitting section 42 changes from the first mode to the second mode, and the light emitting mode of fourth leftmost light emitting section 42 changes from the second mode to the fourth mode. In this way, management control section 88 changes the display modes of light emitting sections 40 in accordance with the movement of mobile robot 50. When mobile robot 50 moves leftwards from the state shown in FIG. 4, the positions of light emitting sections 40 that emit light in the first and second modes also move leftwards. When mobile robot 50 arrives at feeder storage container 60, which is a subsequent movement destination position, light emitting section 46 emits light in the first mode, and light emitting section 48 and leftmost light emitting section 42 emit light in the second mode. Since a subsequent movement destination position is determined newly as a result of mobile robot 50 arriving at feeder storage container 60, light emitting section 40 corresponding to the moving region in accordance with the subsequent movement destination position emits light in the third mode.

Here, correspondences between the constituent elements of the present embodiment and constituent elements of the present disclosure will be clarified. Mounting machine 20 of the present embodiment corresponds to a mounting machine of the present disclosure, mounting line 11 corresponds to a mounting line, mobile robot 50 corresponds to a supply device, light emitting section 42 corresponds to a display section of a first mounting system of the present disclosure, light emitting section 40 and display 56 correspond to a display section of a second mounting system of the present disclosure, and management control section 88 corresponds to a display control section. In addition, memory section 89 corresponds to a memory section, and management device 80 corresponds to a display control device.

In mounting system 10 described in detail above, the display modes of light emitting sections 42 provided individually on mounting machines 20 change in accordance with the movement of mobile robot 50. As a result, the operator can easily determine whether the object (including the operator) is likely to become an obstacle that interrupts the operation of mobile robot 50 based on the display modes of light emitting sections 42. As a result, mounting system 10 can prompt the operator to take appropriate measures such as move an object or prevent the object from coming close to mobile robot 50 as required. Therefore, mounting system 10 can prevent the operation of mobile robot 50 from being interrupted by an obstacle.

In mounting system 10 described in detail above, management control section 88 acquires the position information of mobile robot 50, monitoring region information 89e, and the information on the subsequent movement destination position as the operation-relevant information related to operating mobile robot 50. Then, management control section 88 controls at least one of the display sections (here, light emitting section 40 and display 56) based on the acquired operation-relevant information and causes it to inform the operator of the operation-relevant information related to operating mobile robot 50 (here, the operation interrupting region and the moving direction). As a result, the operator can easily determine whether the object (including the operator) is likely to become an obstacle that interrupts the operation of mobile robot 50 based on the operation information so informed. As a result, mounting system 10 can prompt the operator to take appropriate measures such as move an object or prevent the object from coming close to mobile robot 50 as required. Therefore, mounting system 10 can prevent the operation of mobile robot 50 from being interrupted by an obstacle.

In mounting system 10, the operation-relevant information includes information that can identify the moving direction of mobile robot 50 (here, the position information and the subsequent movement destination position of mobile robot 50). Then, management control section 88 informs the operator of information indicating the direction in which mobile robot 50 moves as the operation information. More specifically, management control section 88 identifies the moving direction of mobile robot 50 based on the position information and the subsequent movement destination position of mobile robot 50 and displays an arrow indicating the identified moving direction on display 56 to inform the operator of the moving direction. In addition, management control section 88 identifies the moving region of mobile robot 50 based on the position information and the subsequent movement destination position of mobile robot 50 and informs the operator of the identified moving region through the positions and the display modes of light emitting sections 40. As a result, the operator can recognize that an object lying in the moving direction of mobile robot 50 can become an obstacle. Therefore, this mounting system 10 can prompt the operator to take appropriate measures, thereby preventing the operation of mobile robot 50 from being interrupted by an obstacle.

Further, in mounting system 10, the operation-relevant information includes information capable of identifying a subsequent movement destination position of mobile robot 50 (here, information representing a subsequent movement destination position identified based on work order information 89d). Then, management control section 88 informs the operator of information indicating the subsequent movement destination position as operation information. Specifically, management control section 88 causes light emitting section 40 corresponding to the subsequent movement destination position to emit light in such a mode (here, in the third mode) such that light emitting section 40 in question can be recognized as the subsequent movement destination position. As a result, the operator can recognize that an object lying in a region between the current position and the displayed subsequent movement destination position of mobile robot 50 can become an obstacle. Therefore, this mounting system can prompt the operator to take appropriate measures and prevent the operation of mobile robot 50 from being interrupted by an obstacle. In addition, management control section 88 acquires the position information and the information on the subsequent movement destination position of mobile robot 50 as the operation-relevant information, identifies light emitting section 40 that corresponds to the moving region of mobile root 50 extending from the current position to the subsequent movement destination position of mobile robot 50 based on the acquired information, and causes one or more light emitting sections 40 so identified to emit light in a recognizable mode (here, in the third mode). As a result, the operator can recognize not only the subsequent movement destination position but also the moving region of mobile robot 50 to the subsequent movement destination position thereof by the display mode of light emitting sections 40.

Mounting system 10 further includes multiple light emitting sections 40 whose positions are fixed and memory section 89 that stores device position information 89*a* including position information of each of multiple light emitting sections 40. In addition, the operation-relevant information includes, as information that can identify the operation interrupting region, the position information of mobile robot 50, the monitoring region information 89*e*, and the information on the subsequent movement destination position. Then, management control section 88 identifies one or more light emitting sections 40, among multiple light emitting sections 40, that are located at positions corresponding to the operation interrupting region based on information capable of identifying the operation interrupting region and the position information of light emitting sections 40 based on device position information 89*a*, and informs the operator of the operation interrupting region by differentiating the display mode of one or more light emitting sections 40 so identified from the display mode of other remaining light emitting sections 40. As a result, the operator can recognize the operation interrupting region by the respective positions and display modes of multiple light emitting sections 40. Therefore, this mounting system 10 can prompt the operator to take appropriate measures, thereby preventing the operation of mobile robot 50 from being interrupted by an obstacle. Moreover, management control section 88 informs the operator of each of the multiple regions (here, the current position, monitoring region S, and the moving area of mobile robot 50) that are included in the operation interrupting region by differentiating the display modes of light emitting sections 40 that correspond to the multiple regions. As a result, the operator can recognize each of the multiple regions included in the operation interrupting region by the respective positions and display modes of multiple light emitting sections 40. Consequently, mounting system 10 can prompt the operator to take more appropriate measures.

The present disclosure is not limited in any way to the embodiment described heretofore, and needless to say, the present disclosure can be carried out in various forms as long as the present disclosure remains within the technical scope thereof.

Figure 5:
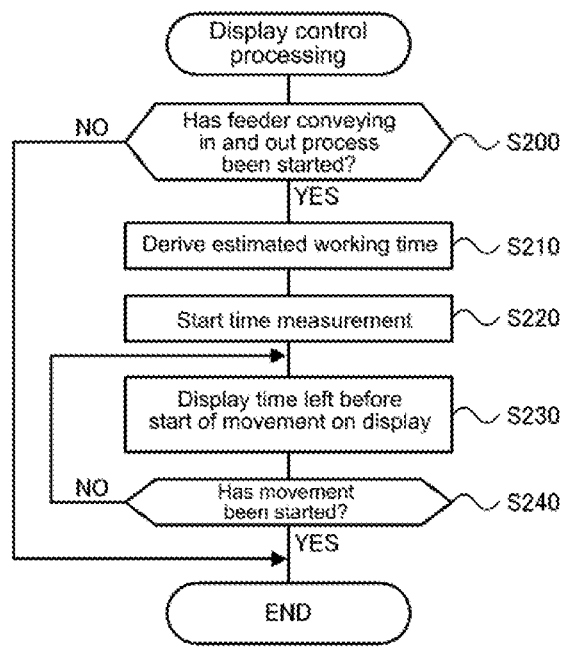
FIG. 5 is a flowchart of display control processing of an alternative embodiment.

For example, in the embodiment described above, management control section 88 informs the operator of the operation interrupting region by the respective position and display modes of multiple light emitting sections 40 and informs the operator of the moving direction of mobile robot 50 by the arrow displayed on display 56; however, management control section 88 may inform the operator of any information as long as the information constitutes operation-relevant information related to operating mobile robot 50. For example, management control section 88 may inform the operator of information representing at least one of the time at which mobile robot 50 starts moving next and the time left before mobile robot 50 starts moving next. FIG. 5 is a flow chart showing an example of display control processing of an alternative embodiment of the case described above. In this display control processing, management control section 88 first determines whether mobile robot 50 has started a process of conveying in and out feeders 30 (step S200). Management control section 88 may determine that mobile robot 50 has started the process of conveying in and out feeders when it detects, for example, that mobile robot 50 has arrived at a movement destination position, or may determine that mobile robot 50 has started the process of conveying in and out feeders when it receives a signal signaling the start of the feeder conveying in and out process from mobile robot 50. Next, management control section 88 derives an estimated operation time of the feeder conveying in and out process (step S210). For example, management control section 88 acquires the number of pieces of work content information (the number of feeders 30 to be conveyed in and out) associated with the current work order in work order information 89*d* as information capable of identifying a subsequent movement starting time of mobile robot 50. In addition, management control section 88 acquires, as information capable of identifying a subsequent movement starting time of mobile robot 50, the time required for one operation (conveying in or out) of feeder 30 stored in advance in memory section 89. Then, management control section 88 derives the estimated working time as a product of the number of pieces of work content information and the time required for one operation that are so acquired. Subsequently, management control section 88 causes a timer to start measuring the elapsed time from the start of the conveying in and out process (step S220), and causes display 56 to display the length of time (for example, the number of seconds) left until mobile robot 50 starts moving based on the difference between the estimated working time and the elapsed time (step S230). Then, management control section 88 waits until mobile robot 50 starts moving (step S240), and if mobile robot 50 has not yet started moving, management control section 88 executes the processing in step S230 repeatedly and causes display 56 to display thereon the time remaining until mobile robot 56 starts moving. Whether management control section 88 has started moving may be determined based on whether the remaining time until mobile robot 50 starts moving has become zero, may be determined based on detection signals from robot detection sensors 25 and 65, or may be determined based on whether management control section 88 has received an end signal of the conveying in and out process from mobile robot 50. If it is determined in step S240 that mobile robot 50 has started moving, management control section 88 ends the display control processing. At this time, management control section 88 may turn off the display of display 56, or may cause display 56 to display an arrow thereon by performing steps S100, S120, S170, S180 of the display control processing of the embodiment described above. In this way, management control section 88 informs the operator of the remaining time until mobile robot 50 starts moving next, thereby allowing the operator to recognize the timing at which an object may become an obstacle based on the displayed remaining time. Therefore, this mounting system 10 can prompt the operator to take appropriate measures such as moving an object to clear a moving path for mobile robot 50 by the time the displayed remaining time becomes zero and can prevent the operation of mobile robot 50 from being interrupted by the obstacle. Instead of or in addition to the remaining time, management control section 88 may cause display 56 to display thereon a time when mobile robot 50 will start moving next. Management control section 88 may derive a time when mobile robot 50 will start moving next based on the derived estimated working time and the time the conveying in and out process was started.

In the embodiment described above, management control section 88 controls light emitting sections 40 and display 56 and causes them to inform the operator of the operation information, but the present disclosure is not limited to this configuration. For example, management control section 88 may inform the operator of the operation information using only light emitting sections 40 whose positions are fixed, or may inform the operator of the operation information using only display 56. Alternatively, management control section 88 may inform the operator of the operation information using only display sections whose positions are fixed (for example, at least one of display 26 or light emitting sections 40). Here, the display sections whose positions are fixed are display sections disposed on devices other than the moving body (for example, mobile robot 50). Light emitting section 40 need not be disposed on at least one of feeder storage container 60 and management device 80. In addition, the display section may be disposed on devices other than the devices constituting mounting line 11 and mobile robot 50. For example, the display section may be disposed on a ceiling, a floor, or the like of the place where mounting line 11 is positioned. In this case, memory section 89 may store position information of the display section separately from device position information 89*a*. In addition, multiple light emitting sections 40 may be disposed on each of the devices constituting mounting line 11. By arranging light emitting sections 40 on a single device in such a manner as to be aligned side by side in the X direction, the operator can be informed of the operation interrupting region not as a single region corresponding to a unit device but as segmented regions. Also in this case, memory section 89 may store position information of the display section separately from device position information 89*a*.

In the embodiment described above, the operator is informed of the operation interrupting region by the positions and the light emitting modes of light emitting sections 40, but the present disclosure is not limited to this configuration. For example, management control section 88 may inform the operator of the operation interrupting region by characters, images, or the like using one or more of multiple displays 26 and display 56. For example, management control section 88 may inform the operator of monitoring region S by displaying on display 56 or display 26 of mounting machine 20 positioned directly behind display 56 a numerical value indicating how many adjacent devices are included in monitoring region S (a value of 1 in the embodiment described above). As to the arrow indicating the moving direction of mobile robot 50, management control section 88 may cause not only display 56 but also the other display sections such as displays 26 to display the arrow thereon.

In the embodiment described above, management control section 88 controls the display sections so as to inform the operator of the operation information, but the present disclosure is not limited to this configuration. The control of the display section need only be performed by one or more of management control section 88, mounting control section 28, and robot control section 58, and hence, may be performed by one control section or may be performed by multiple control sections in multiple control sections working in conjunction with each other. For example, multiple mounting control sections 28 may work in conjunction to control the display of multiple light emitting sections 42. For example, mounting control section 28 may determine whether the current position of mobile robot 50 is located directly in front of a device (mounting machine 20) on which mounting control section 28 in question is provided based on a detection signal from robot detection sensor 25 of the device in question, and if it determines that the current position of mobile robot 50 is directly in front of the device in question, mounting control section 28 may cause light emitting section 40 of the device in question to emit light in the first mode. In this case, monitoring region information 89*e* may be stored in memory section 29 in advance, and mounting control section 28 may transmit a light emission command to mounting machines 20 (for example, mounting machines 20 located directly to the left and right of the device or mounting machine 20 in question) included in monitoring region S defined around the device or mounting machine 28 in question based on monitoring region information 89*e* to cause mounting machines 20 included in monitoring region S to illuminate corresponding light emitting sections 42 in the second mode. In this case, when receiving the light emission command, mounting control sections 28 of those mounting machines 20 need only cause corresponding light emitting sections 42 to light in the second mode. In addition, when mounting control section 28 receives information informing that mounting machine 20 on which mounting control section 28 is provided is located in a subsequent movement destination position from management control section 88, the mounting control section 28 in question may cause corresponding light emitting section 42 to emit light in the third mode. Further, in a case where mounting control section 28 is not in any one of the states where light is to be emitted in any one of the first to third modes described above, mounting control section 28 may cause corresponding light emitting section 42 to emit light in the fourth mode. The display control of display 56 may also be performed by robot control section 58. For example, robot control section 58 may determine a moving direction of mobile robot 50 based on position information of the device on which robot control section 58 is provided (mobile robot 50) based on encoder 53 and information on a subsequent movement destination position inputted from management control section 88, and display information representing the moving direction on display 56. The display control processing shown in FIG. 5 may also be performed by robot control section 58.

In an embodiment described above, management control section 88 identifies the subsequent movement destination position based on work order information 89*d*, but the present disclosure is not limited to this configuration. For example, management control section 88 may repeatedly acquire detection signals of robot detection sensors 25, 65 or encoder 53, and identify the start of movement and the moving direction of mobile robot 50 based on the acquired time and the contents of the acquired detection signals. When the control section other than management control section 88 performs the display control, information that can identify a subsequent movement destination position may be acquired from management control section 88.

In an embodiment described above, management control section 88 identifies light emitting sections 40 located in the position corresponding to the moving region of mobile robot 50 in step S150 in FIG. 4, but the present disclosure is not limited to this configuration. For example, management control section 88 may identify light emitting section 40 corresponding to the subsequent movement destination position based on information on the subsequent movement destination position so acquired and cause only light emitting section 40 so identified to emit light in the third mode. Even with this configuration, the operator can recognize that an object located in a region defined between the current position of mobile robot 50 and light emitting section 40 emitting light in the third mode can become an obstacle.

In an embodiment described above, the operation interrupting region includes multiple types of regions (the current position, monitoring region S, and the moving region of mobile robot 50), one or more of these position and regions may be omitted, or other types of regions may be added. For example, when mobile robot 50 does not include surrounding environment monitoring sensor 55, management control section 88 may inform the operator of the current position and the moving region of mobile robot 50.

In an embodiment described above, the colors of emitted light are used as the light emitting modes of light emitting sections 40, but the present disclosure is not limited to this configuration. For example, in differentiating the light emitting modes, management control section 88 may differentiate flashing patterns or switch between ON and OFF.

In the embodiment described above, the member conveyed and supplied by mobile robot 50 is feeder 30, but the present disclosure is not limited to this configuration, and hence, the member may be any member as long as the member is used in mounting machines 20 of mounting line 11. For example, mobile robot 50 may convey a suction nozzle to supply the suction nozzle to mounting machine 20.

Figure 6:
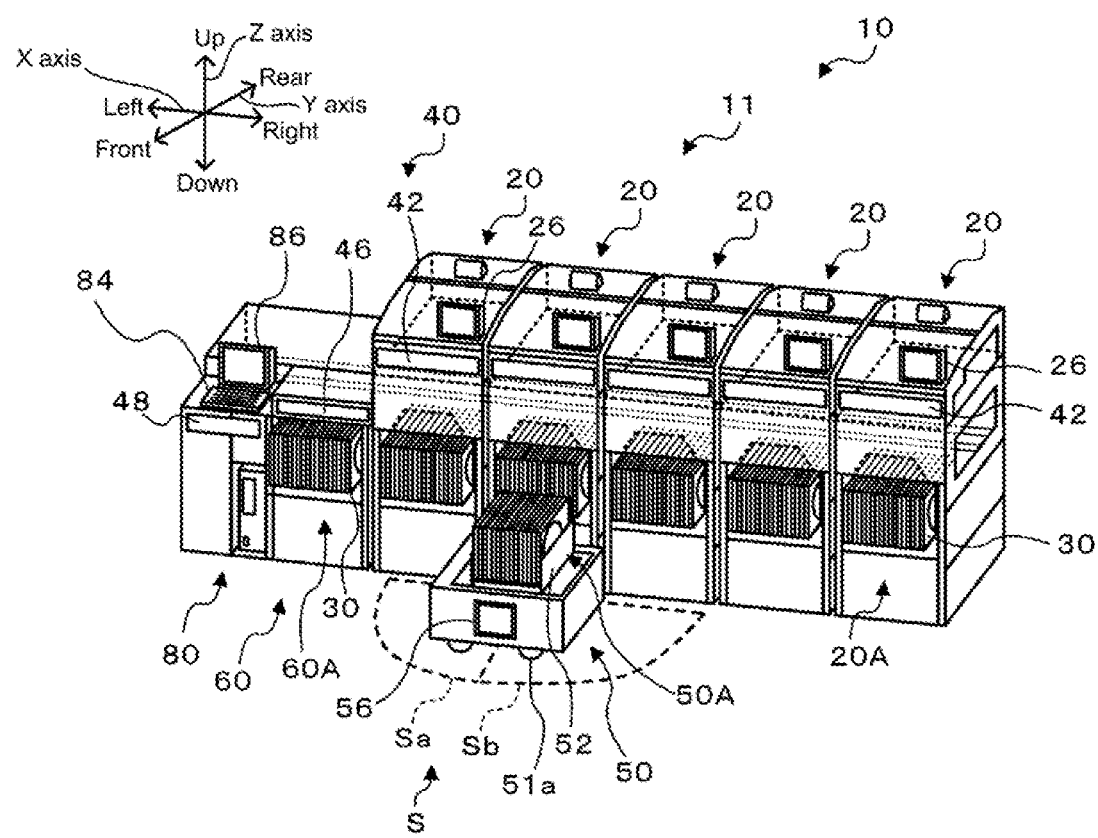
FIG. 6 is a block diagram showing schematically mounting system 10 including mobile robot 50 of the alternative embodiment.

In an embodiment described above, mounting system 10 includes X-axis rail 18 disposed at the front of multiple mounting machines 20 that is at right angles to the arrangement direction of multiple mounting machines 20 and the up-down direction along the arrangement direction, and mobile robot 50 moves along X-axis rail 18 in the arrangement direction; however, the present disclosure is not limited to this configuration, and mobile robot 50 need only be able to move in the arrangement direction. For example, as shown in FIG. 6, mobile robot 50 may be an AGV that moves on wheels 51a. In this case, mounting system 10 does not have to include X-axis rail 18. In mobile robot 50 of an alternative embodiment shown in FIG. 6, mobile robot 50 moves in the arrangement direction by robot moving mechanism 51 driving wheels 51a. Mobile robot 50 may be movable not only in the arrangement direction (here, in the left-right direction) but also in the front-rear direction. In this mobile robot 50, robot transfer area 50A and feeder transfer mechanism 52 are provided at an upper portion of the housing of mobile robot 50.

In an embodiment described above, mobile robot 50 includes encoder 53, but mobile robot 50 may include a position sensor in addition to or in place of encoder 53. In particular, in the case where mobile robot 50 is an AGV, mobile robot 50 preferably includes a position sensor. The position sensor is a sensor for detecting a position of mobile robot 50 and may also be configured to detect a direction (rotation) of mobile robot 50. Examples of position sensors include GPS sensors, gyro sensors, geomagnetic sensors, acceleration sensors, and the like, and mobile robot 50 may include one or more of these sensors as a position sensor or sensors. Management control section 88 may acquire position information of mobile robot 50 detected by the position sensor from robot control section 58.

First and second mounting systems and a display control device of the present disclosure may be configured as follows.

The first mounting system of the present disclosure may include a rail disposed along the arrangement direction, and the supply device may move along the rail in the arrangement direction.

In the first mounting system of the present disclosure, the supply device may move in the arrangement direction using a wheel.

In the second mounting system of the present disclosure, the operation-relevant information may include information capable of identifying a moving direction of the supply device, and the display control section may inform the operator of information indicating in which direction the supply device moves as the operation information. As a result, the operator can recognize that an object located in the moving direction of the supply device can become an obstacle. Therefore, this mounting system can prompt the operator to take appropriate measures, thereby preventing the operation of the supply device from being interrupted by an obstacle.

In the second mounting system of the present disclosure, the operation-relevant information may include information capable of identifying a subsequent movement destination position of the supply device, and the display control section may inform the operator of information indicating the subsequent movement destination position as the operation information. As a result, the operator can recognize that an object located in the region between the current position of the supply device and the displayed subsequent movement destination position can become an obstacle. Therefore, this mounting system can prompt the operator to take appropriate measures, thereby preventing the operation of the supply device from being interrupted by an obstacle.

In the second mounting system of the present disclosure, the operation-relevant information may include information capable of identifying a subsequent movement starting time of the supply device, and the display control section may inform the operator of information indicating at least one of the time when the supply device starts moving next and the period of time left before the supply device starts moving next. As a result, the operator can recognize the timing at which the object can become an obstacle based on the displayed time or the remaining period of time. Therefore, this mounting system can prompt the operator to take appropriate measures, thereby preventing the operation of the supply device from being interrupted by an obstacle.

The second mounting system of the present disclosure may include multiple of the display sections whose positions are fixed and a memory section configured to store position information of each of the multiple display sections, and the operation-relevant information may include information capable of identifying an operation interrupting region where an obstacle, if such an obstacle is present, is likely to interrupt an operation of the supply device, and the display control section may identify one or more of the display sections, among the multiple display sections, that are located in a position corresponding to the operation interrupting region based on information capable of identifying the operation interrupting region and the position information and inform the operator of the operation interrupting region by differentiating the display mode of the one or more identified display sections from the display mode of the other remaining display sections. As a result, the operator can recognize the operation interrupting region from the respective positions of the multiple display sections and the display modes thereof. Therefore, this mounting system can prompt the operator to take appropriate measures, thereby preventing the operation of the supply device from being interrupted by an obstacle.

In the second mounting system of the present disclosure, at least one of the display sections may be provided on either of the mounting machine and the supply device.

In the first mounting system of the present disclosure, the various forms of the second mounting system described above may be adopted, or the configurations of the second mounting system described above may be added. In the second mounting system of the present disclosure, the various forms of the first mounting system described above may be adopted, or the configurations of the first mounting system described above may be added.

In the display control device of the present disclosure, the various forms of the first and second mounting systems described above may be adopted, or a configuration for realizing the respective functions of the first and second mounting systems described above may be added.

INDUSTRIAL APPLICABILITY

The present disclosure can be applied to the manufacturing industry of mounting lines and the like.

REFERENCE SIGNS LIST 10 mounting system, 11 mounting line, 18 X-axis rail, 20 mounting machine, 20A supply area, 21 board conveyance device, 22 head, 23 head moving mechanism, 24 connector, 25 robot detection sensor, 26 display, 28 mounting control section, 29 memory section, 30 feeder, 40, 42, 46, 48 light emitting section, 50 mobile robot, 50A robot transfer area, 51 robot moving mechanism, 51a wheel, 52 feeder transfer mechanism, 53 encoder, 55 surrounding environment monitoring sensor, 55a left side monitoring sensor, 55b right side monitoring sensor, 56 display, 58 robot control section, 59 memory section, 60 feeder storage container, 60A storage area, 64 connector, 65 robot detection sensor, 80 management device, 84 input device, 86 display, 88 management control section, 89 memory section, 89a device position information, 89b production program, 89c feeder holding information, 89d work order information, 89e monitoring region information, S monitoring region, Sa left monitoring region, Sb right monitoring region

The invention claimed is:

1. A mounting system comprising:
a mounting line including multiple mounting machines configured to mount components on a board and aligned in a predetermined arrangement direction;
a supply device configured to supply members for use in the mounting machines by conveying the members while moving in the arrangement direction; and
a display provided on each of the mounting machines and having display modes that change in accordance with movement of the supply device,
wherein each of at least two of the displays disposed on different ones of the mounting machines displays in accordance with a different one of the display modes, each of the different one of the display modes determined based upon information of the supply device, and
wherein the information of the supply device includes position information of the supply device.

2. The mounting system of claim 1, comprising:
a rail disposed along the arrangement direction,
wherein the supply device moves along the rail in the arrangement direction.

3. The mounting system of claim 1,
wherein the supply device moves in the arrangement direction using a wheel.

4. A mounting system comprising:
a mounting line including multiple mounting machines configured to mount components on a board;
a supply device configured to convey members for use in the mounting line;
a plurality of displays configured to display information for an operator; and
circuitry configured to:
acquire operation-relevant information related to operating the supply device, and
control each of at least two of the displays disposed on different ones of the mounting machines to display the information in accordance with a different one of a plurality of display modes, each of the different one of the plurality of display modes determined based on the acquired operation-relevant information related to operating the supply device,
wherein the operation-relevant information related to operating the supply device includes position information of the supply device.

5. The mounting system of claim 1, wherein each of at least three of the displays displays in accordance with a different one of the display modes, each of the different one of the display modes determined based upon information of the supply device.

6. The mounting system of claim 1, wherein each of at least four of the displays displays in accordance with a different one of the display modes, each of the different one of the display modes determined based upon information of the supply device.

7. The mounting system according to claim 4,
wherein the operation-relevant information includes information capable of identifying a moving direction of the supply device, and
wherein the information indicates in which direction the supply device moves.

8. The mounting system according to claim 4,
wherein the operation-relevant information includes information capable of identifying a subsequent movement destination position of the supply device, and
wherein the information indicates the subsequent movement destination position.

9. The mounting system according to claim 4,
wherein the operation-relevant information includes information capable of identifying a subsequent movement starting time of the supply device, and
wherein the information indicates at least one of a time when the supply device starts moving next and a period of time left before the supply device starts moving next.

10. The mounting system according to claim 4,
wherein a multiple of the displays each have a fixed position,
wherein the mounting system includes a memory configured to store position information of each of the multiple displays,
wherein the operation-relevant information includes information capable of identifying an operation interrupting region in which there is an obstacle, the obstacle being likely to interrupt an operation of the supply device, and
wherein the circuitry is configured to:
identify one or more the displays, among the multiple displays, that are located in a position corresponding to the operation interrupting region based on the information capable of identifying the operation interrupting region and the position information, and inform the operator of the operation interrupting region by differentiating a display mode of the one or more of the identified displays from a display mode of the other remaining displays.

11. The mounting system according to claim 4, wherein at least one of the displays is provided on one of the mounting machines and the supply device.

12. A display control device configured to be used in a mounting system including a mounting line comprising multiple mounting machines configured to mount components on a board, a supply device configured to convey members for use in the mounting line, and a plurality of displays configured to display information for an operator, the display control device comprising:

circuitry configured to:

acquire operation-relevant information related to operating the supply device; and control each of at least two of the displays disposed on different ones of the mounting machines to display the information in accordance with a different one of a plurality of display modes, each of the different one of the plurality of display modes determined based on the acquired operation-relevant information related to operating the supply device, wherein the operation-relevant information related to operating the supply device includes position information of the supply device.

13. The control device according to claim 12, wherein the circuitry is configured to control each of at least three of the displays to display the information in accordance with a different one of a plurality of display modes, each of the different one of the plurality of display modes determined based on the acquired operation-relevant information related to operating the supply device.

14. The control device according to claim 13, wherein the circuitry is configured to control (1) a first mounting machine that is directly adjacent to the left of a second mounting machine having the supply device located directly in front thereof and (2) a third mounting machine that is directly adjacent to the right of the second mounting machine to display the information in accordance with a same one of the plurality of display modes.

15. The control device according to claim 12, wherein the circuitry is configured to control each of at least four of the displays to display the information in accordance with a different one of a plurality of display modes, each of the different one of the plurality of display modes determined based on the acquired operation-relevant information related to operating the supply device.

16. The control device according to claim 15, wherein the circuitry is configured to control (1) a first mounting machine that is directly adjacent to the left of a second mounting machine having the supply device located directly in front thereof and (2) a third mounting machine that is directly adjacent to the right of the second mounting machine to display the information in accordance with a same one of the plurality of display modes.

17. The control device according to claim 12, wherein the circuitry is configured to control each of at least five of the displays to display the information in accordance with a different one of a plurality of display modes, each of the different one of the plurality of display modes determined based on the acquired operation-relevant information related to operating the supply device.

18. The control device according to claim 17, wherein the circuitry is configured to control (1) a first mounting machine that is directly adjacent to the left of a second mounting machine having the supply device located directly in front thereof and (2) a third mounting machine that is directly adjacent to the right of the second mounting machine to display the information in accordance with a same one of the plurality of display modes.

19. The control device according to claim 12, wherein the circuitry is configured to control (1) a first mounting machine that is directly adjacent to the left of a second mounting machine having the supply device located directly in front thereof and (2) a third mounting machine that is directly adjacent to the right of the second mounting machine to display the information in accordance with a same one of the plurality of display modes.

20. The control device according to claim 12, wherein the circuitry is configured to control each of the at least two of the displays disposed on the different ones of the mounting machine to simultaneously display the information in accordance with the different one of the plurality of the display modes.

* * * * *